United States Patent
Lin et al.

(10) Patent No.: US 11,163,342 B1
(45) Date of Patent: Nov. 2, 2021

(54) SYSTEM AND METHOD FOR SECURING COMPONENTS IN A CHASSIS

(71) Applicant: Dell Products L.P., Hopkinton, MA (US)

(72) Inventors: Kuang Hsi Lin, Taoyuan (TW); Yi Chang Chen, New Taipei (TW)

(73) Assignee: Dell Products, L.P., Round Rock, TX (US)

( * ) Notice: Subject to any disclaimer, the term of this patent is extended or adjusted under 35 U.S.C. 154(b) by 31 days.

(21) Appl. No.: 16/903,340

(22) Filed: Jun. 16, 2020

(51) Int. Cl.
| | |
|---|---|
| *H05K 7/14* | (2006.01) |
| *H05K 7/18* | (2006.01) |
| *G06F 1/18* | (2006.01) |
| *G06F 3/01* | (2006.01) |

(52) U.S. Cl.
CPC .............. *G06F 1/186* (2013.01); *G06F 3/016* (2013.01); *H05K 7/1404* (2013.01); *H05K 7/1418* (2013.01)

(58) Field of Classification Search
USPC ........................................................ 361/801
See application file for complete search history.

(56) References Cited

U.S. PATENT DOCUMENTS

| | | | |
|---|---|---|---|
| 6,466,448 B1* | 10/2002 | Baik ....................... | G06F 1/183 361/752 |
| 6,515,867 B2* | 2/2003 | Sheng-Hsiung ........ | G06F 1/184 211/41.17 |
| 2010/0153608 A1* | 6/2010 | Olesiewicz .......... | H05K 7/1487 710/303 |

* cited by examiner

*Primary Examiner* — Hung S. Bui
(74) *Attorney, Agent, or Firm* — Chamberlain, Hrdlicka, White, Williams & Aughtry

(57) ABSTRACT

A chassis includes a housing of an expansion card receiver adapted to house an expansion card and limit removal of the expansion card to a removal path; and a card holder of the expansion card. The card holder, while a retention member of the card holder is disposed in the removal path, receives a translation force directed away from the expansion card along the removal path; in response to receiving the translation force: translates the retention member along the removal path away from the expansion card until the retention member reaches a translation limiter to transition the retention member from a translatable state to a rotatable state, while the retention member is in the rotatable state and not in the translatable state: receives a rotation force directed out of the removal path; and in response to receiving the rotation force, rotate the retention member out of the removal path.

20 Claims, 14 Drawing Sheets

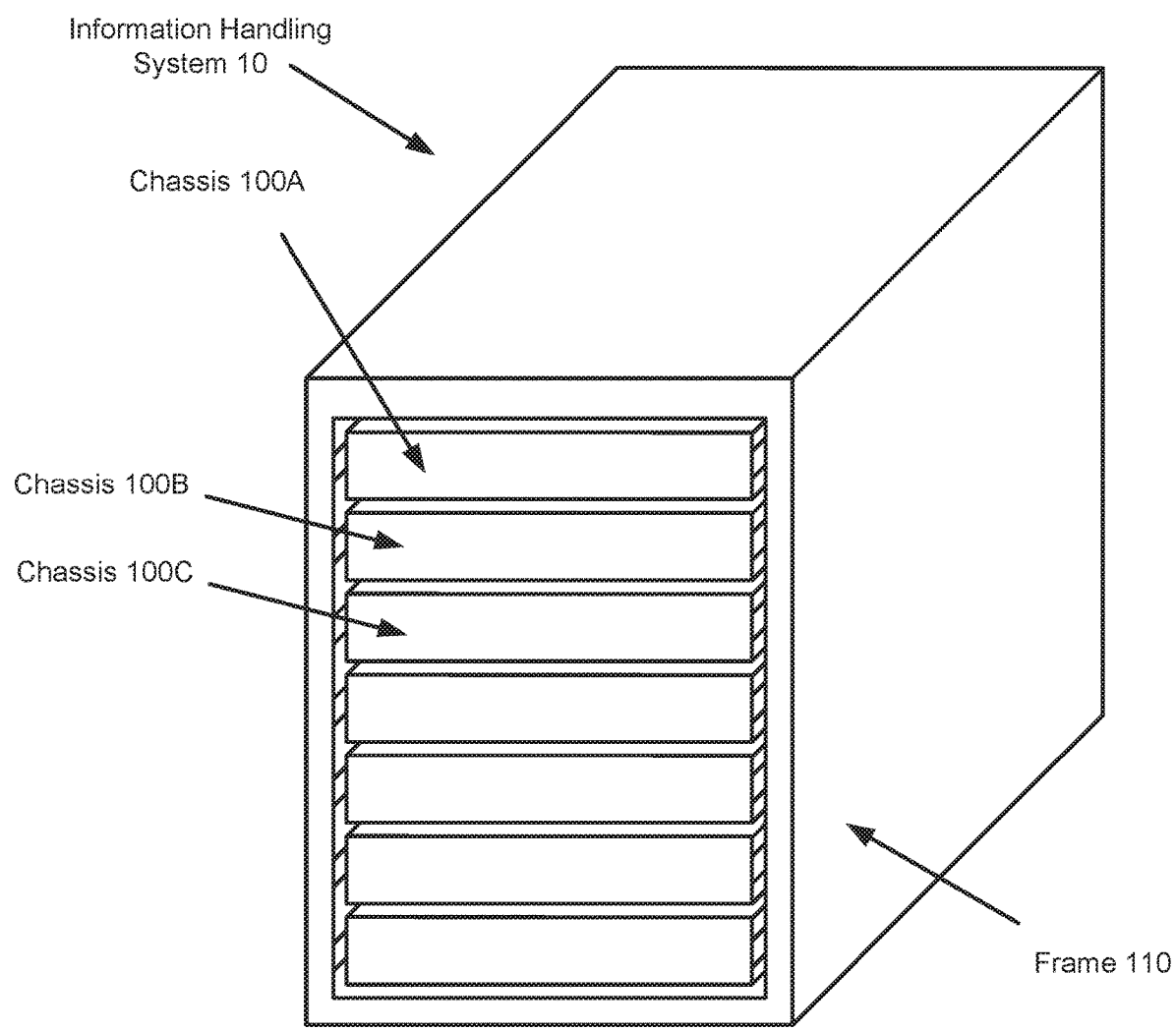
FIG. 1.1

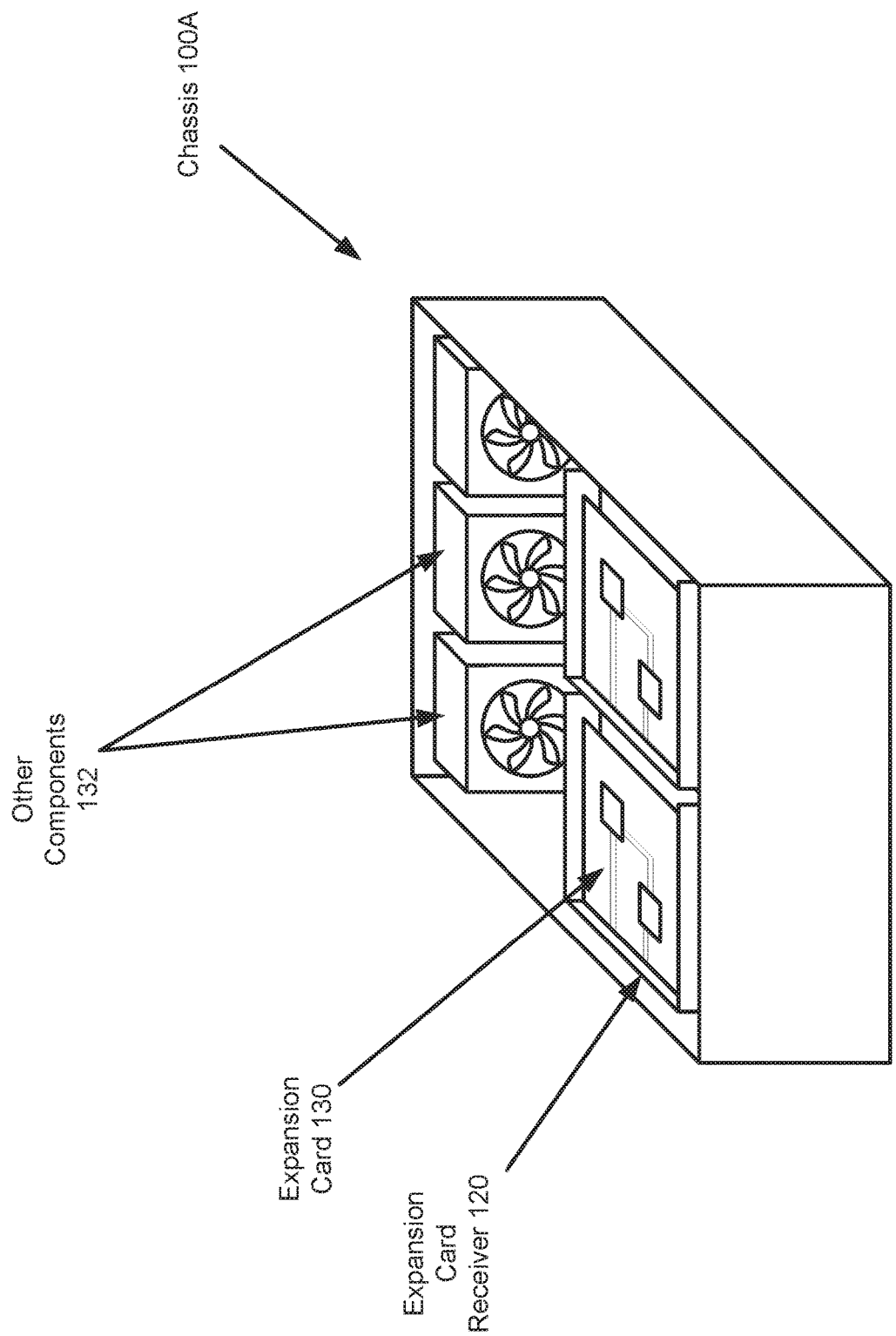
FIG. 1.2

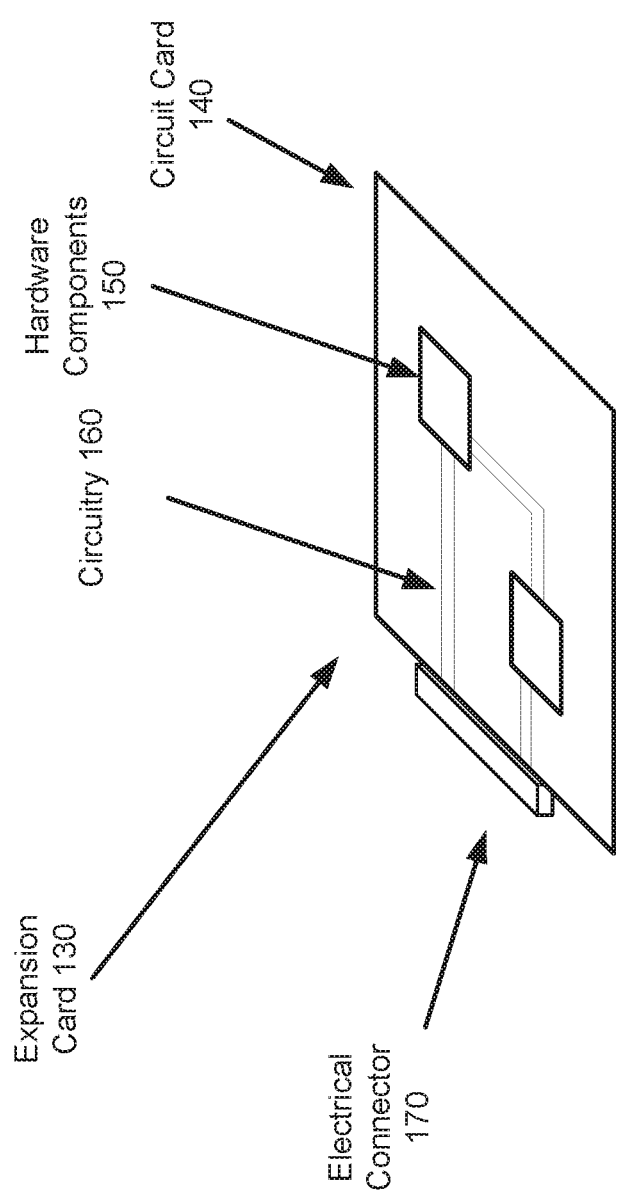
FIG. 1.3

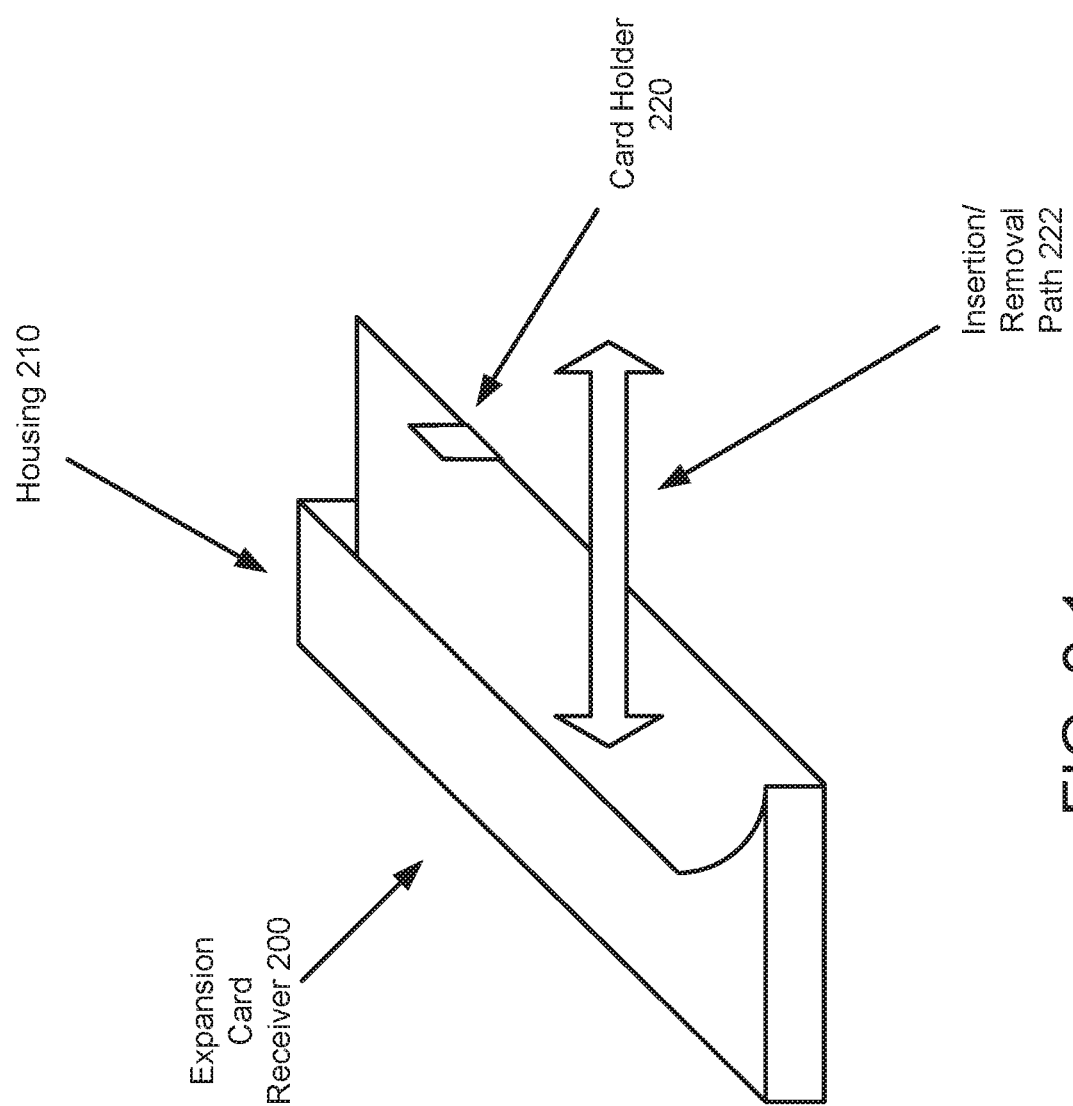
FIG. 2.1

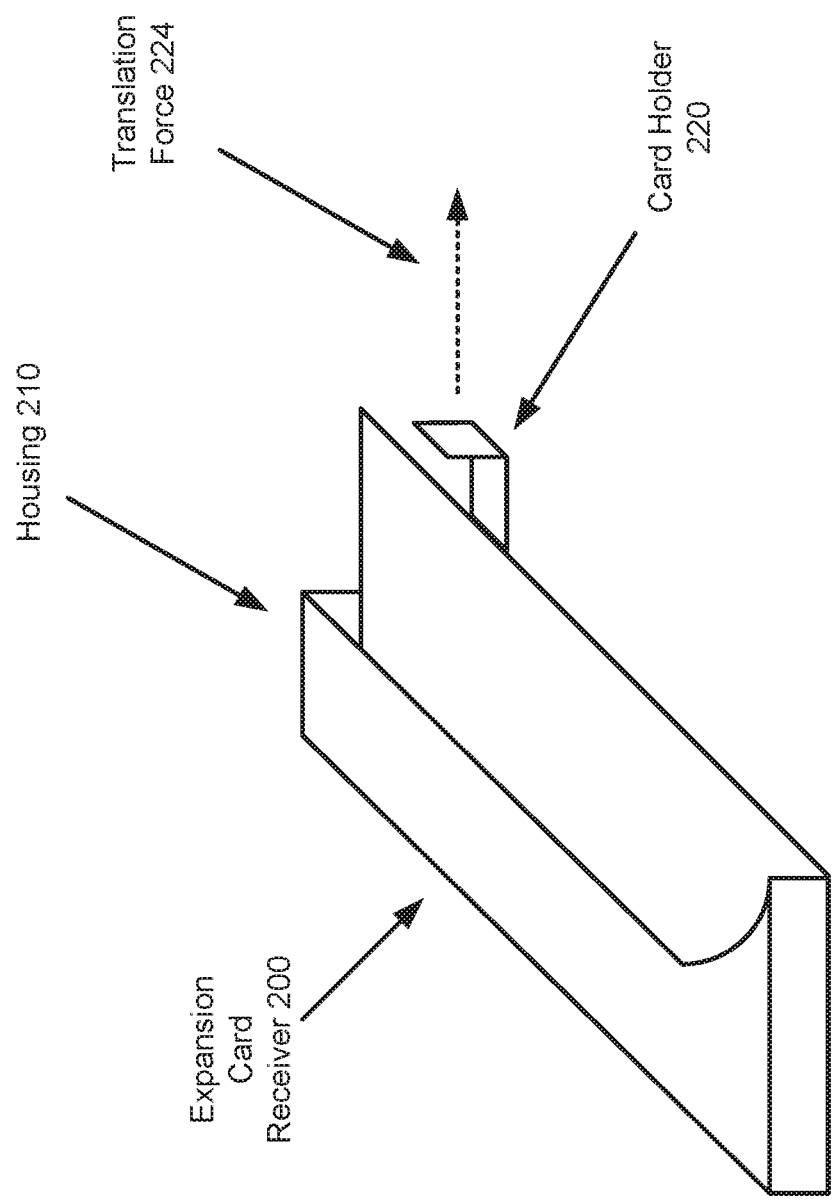
FIG. 2.2

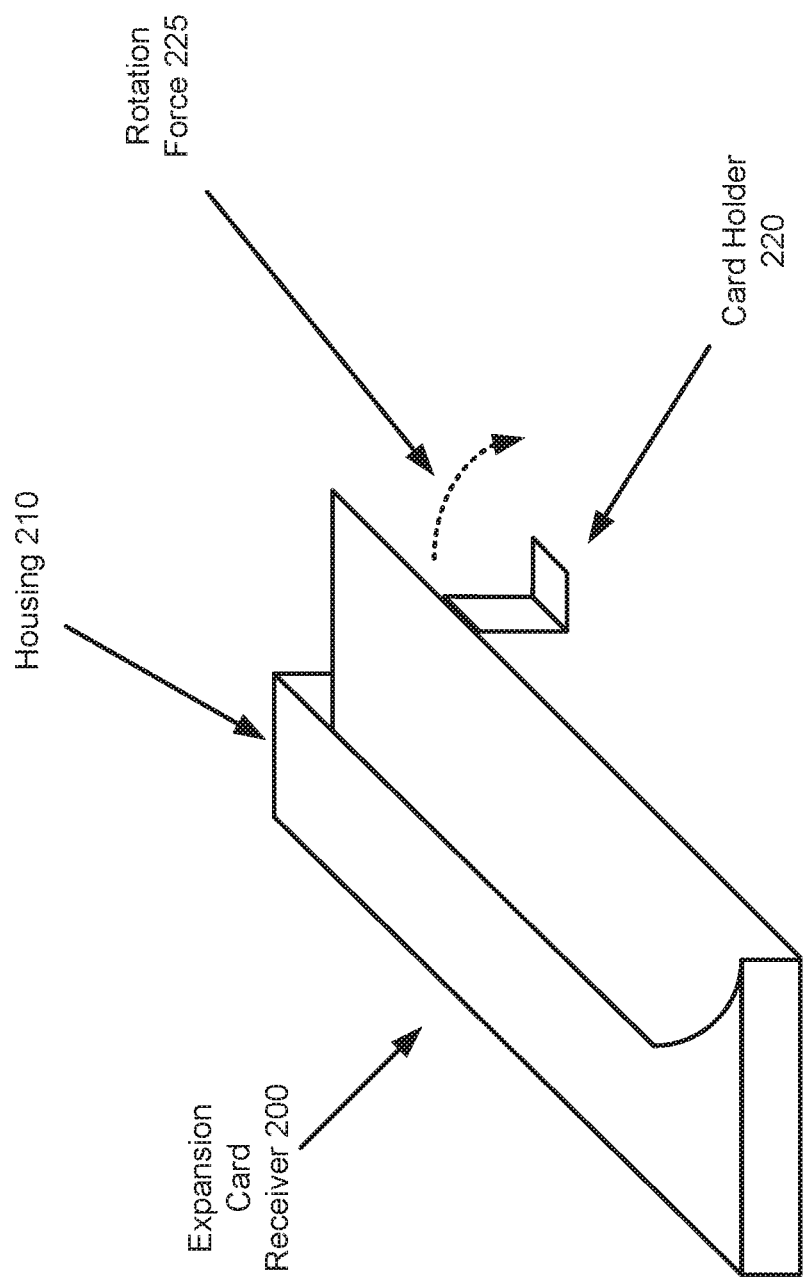
FIG. 2.3

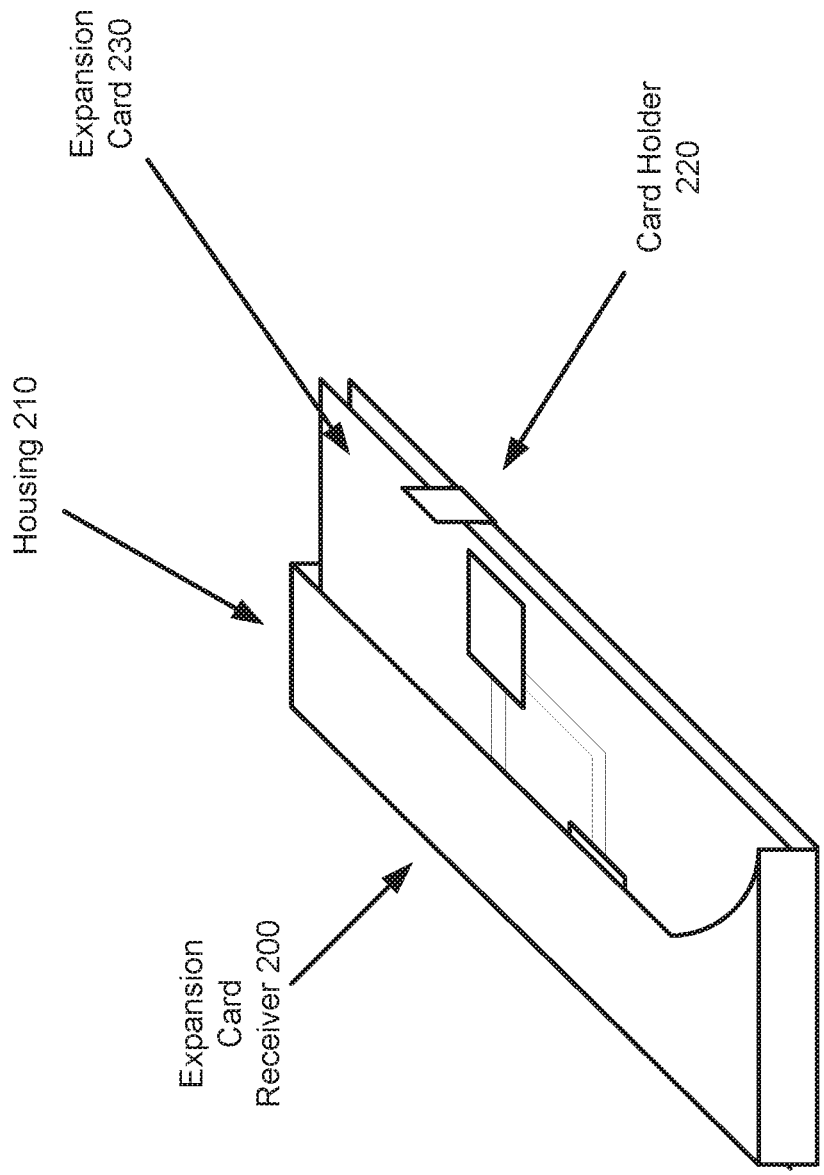
FIG. 2.4

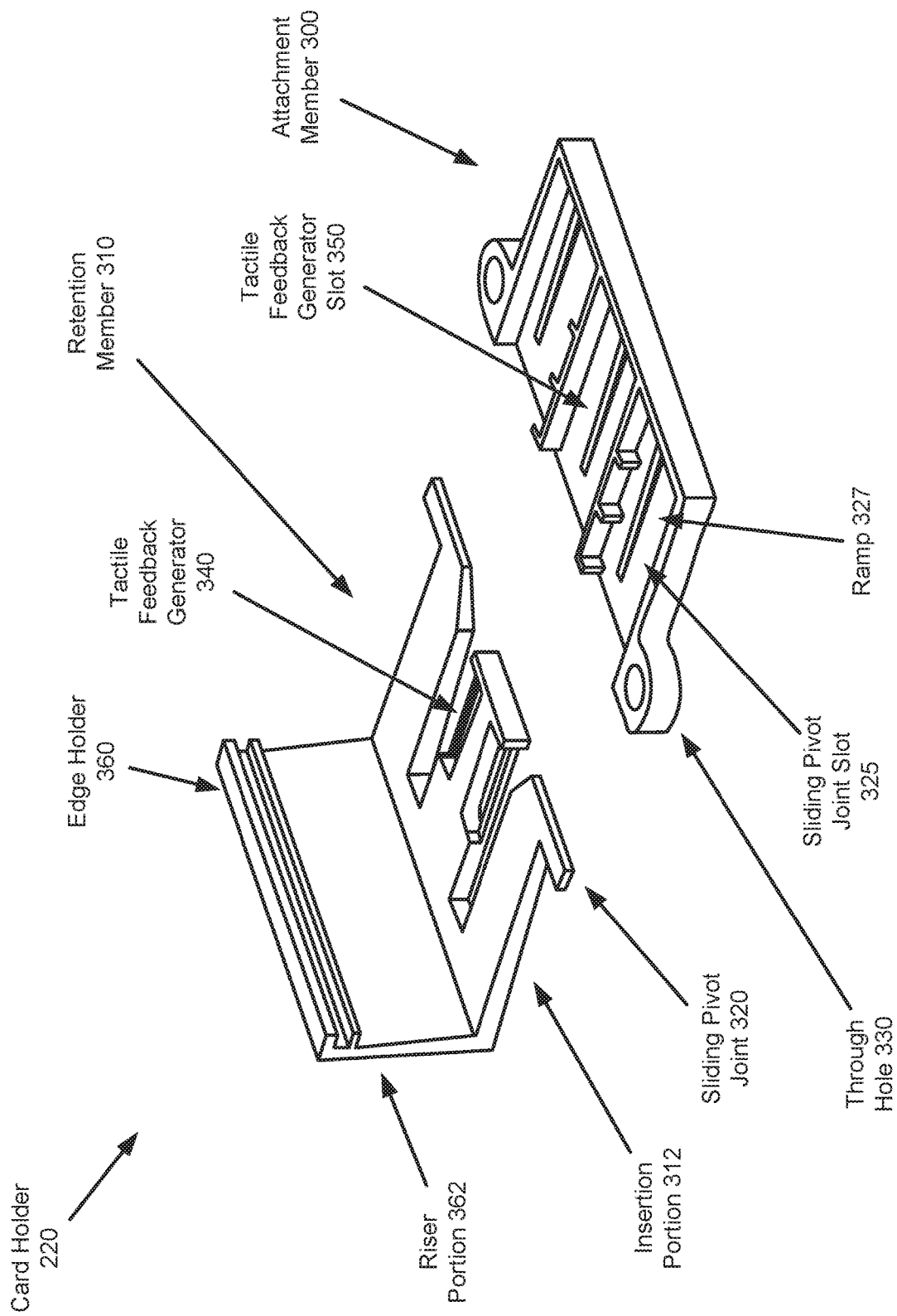
FIG. 3.1

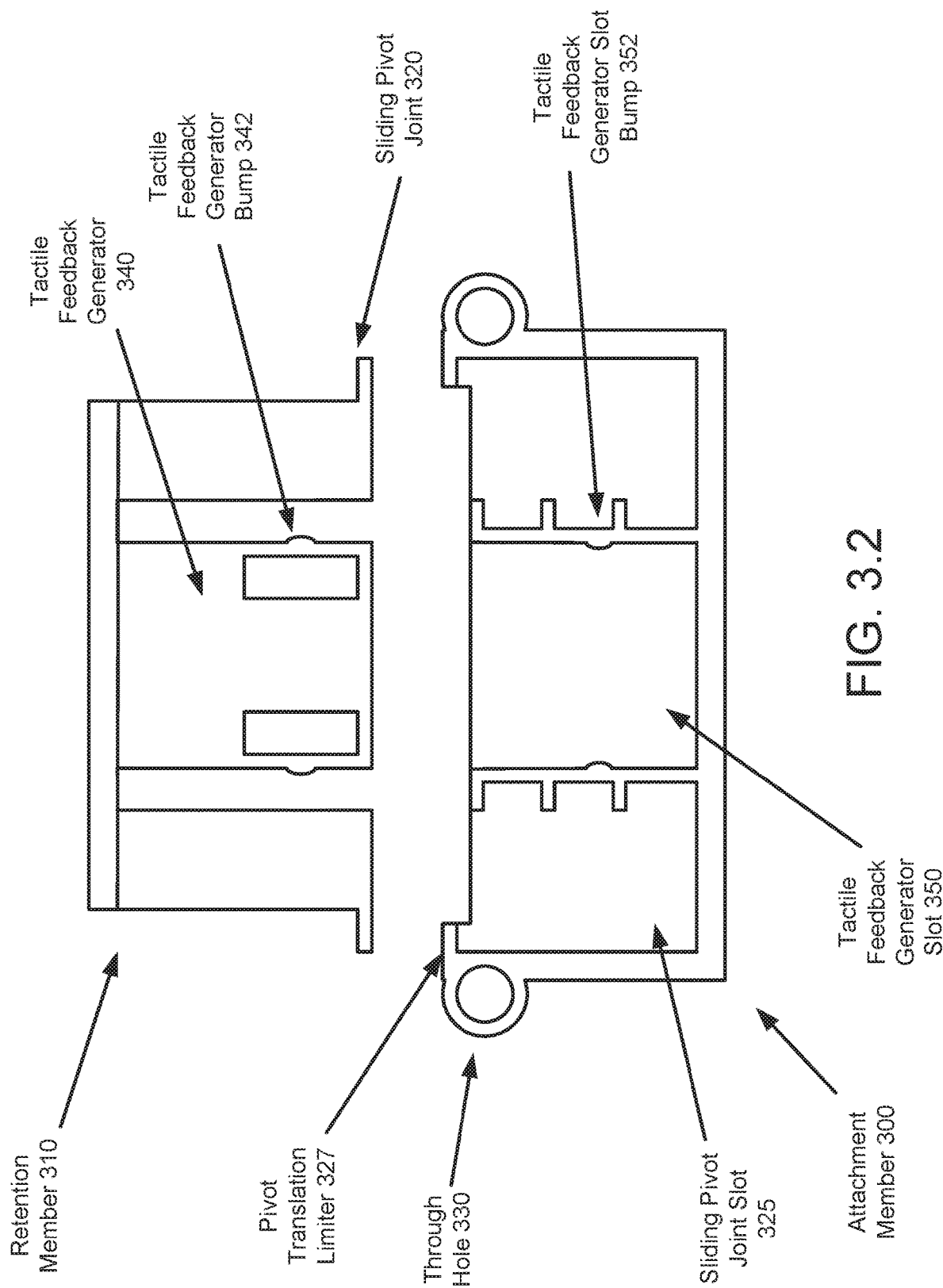
FIG. 3.2

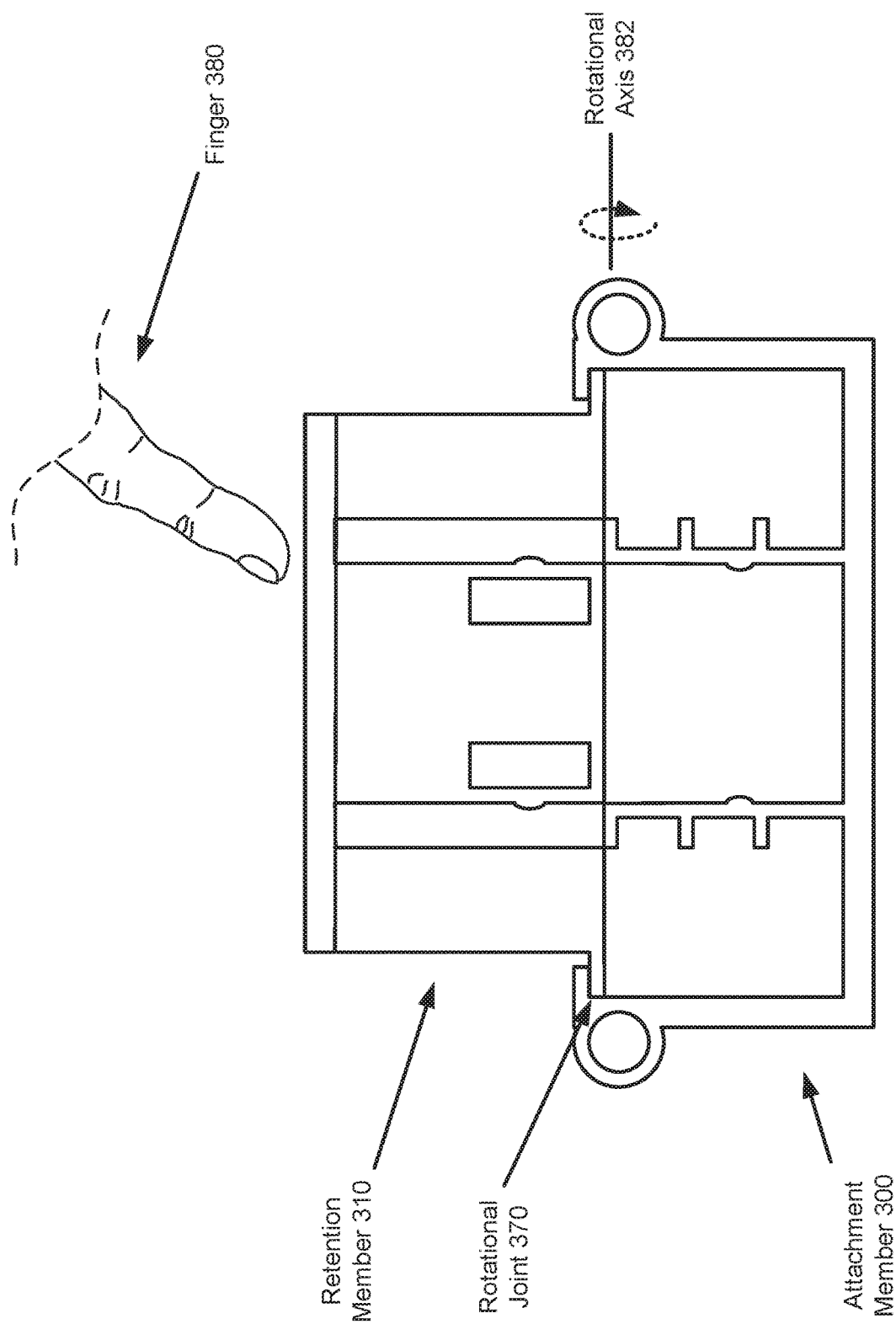
FIG. 3.3

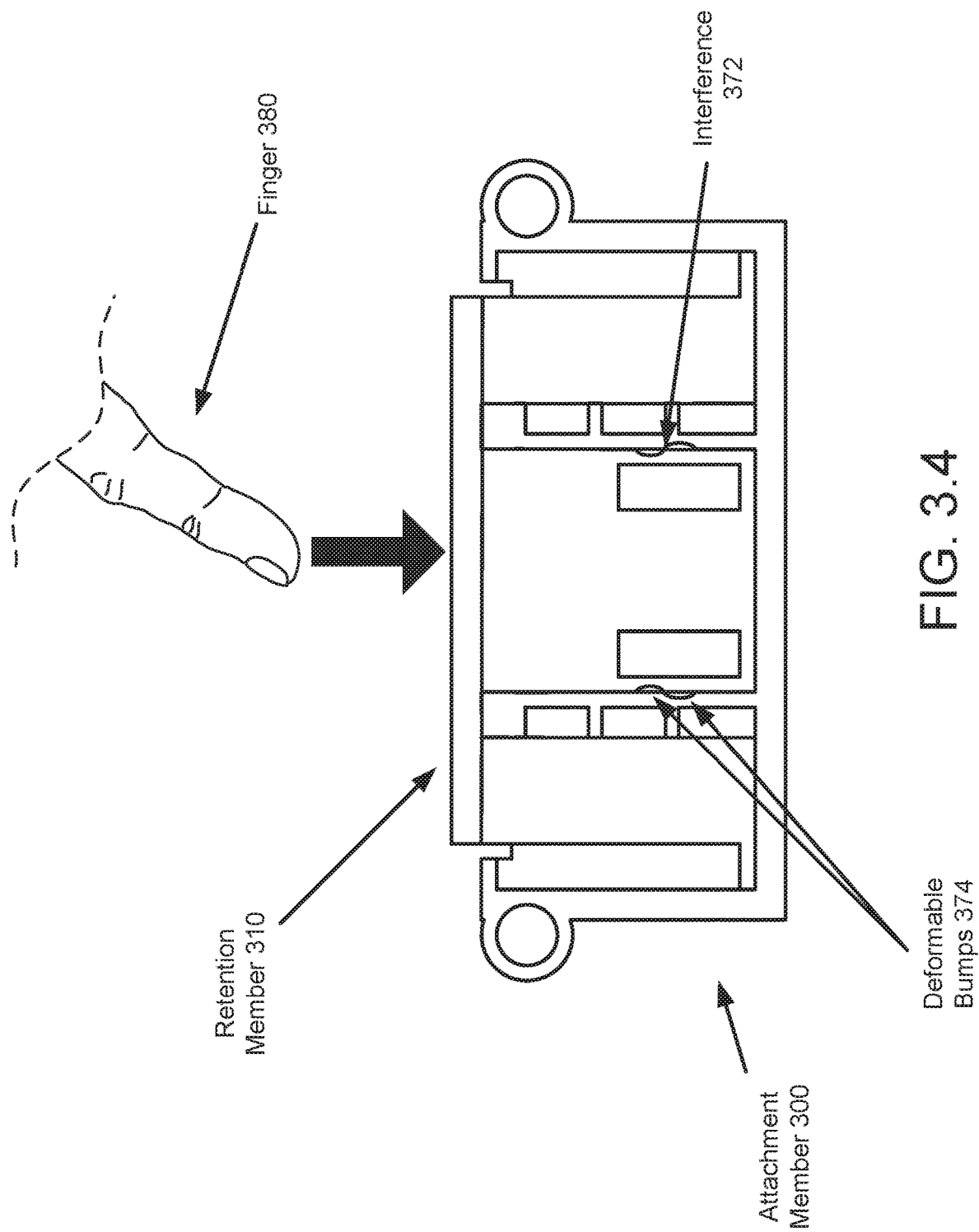
FIG. 3.4

SYSTEM AND METHOD FOR SECURING COMPONENTS IN A CHASSIS

BACKGROUND

As the value and use of information continues to increase, individuals and businesses seek additional ways to process and store information. One option available to users is information handling systems. An information handling system (IHS) generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Use cases for information handling systems are causing progressively larger number of information handling systems to be disposed near each other. For example, rack mount systems utilize a rack structure to stack many information handling systems in a vertical arrangement. Due to the changing uses of information handling systems, chassis of information handling systems may modular. That is, a chassis may be composed of multiple enclosures that may be attached to each other to form the chassis of the information handling systems. When the multiple enclosures are attached, components of the information handling system disposed in each of the enclosures may become operably connected to each other.

SUMMARY

In one aspect, a chassis for housing a computing device of an information handling system in accordance with one or more embodiments of the invention includes a housing of an expansion card receiver adapted to house an expansion card and limit removal of the expansion card to a removal path; and a card holder of the expansion card. The card holder, while a retention member of the card holder is disposed in the removal path, receives a translation force directed away from the expansion card along the removal path; in response to receiving the translation force: translates the retention member along the removal path away from the expansion card until the retention member reaches a translation limiter to transition the retention member from a translatable state to a rotatable state, while the retention member is in the rotatable state and not in the translatable state: receives a rotation force directed out of the removal path; and in response to receiving the rotation force, rotate the retention member out of the removal path.

In one aspect, an expansion card receiver in accordance with one or more embodiments of the invention includes a housing for housing an expansion card and limiting removal of the expansion card to a removal path and a card holder. The card holder, while a retention member of the card holder is disposed in the removal path, receives a translation force directed away from the expansion card along the removal path; in response to receiving the translation force: translates the retention member along the removal path away from the expansion card until the retention member reaches a translation limiter to transition the retention member from a translatable state to a rotatable state, while the retention member is in the rotatable state and not in the translatable state: receives a rotation force directed out of the removal path; and in response to receiving the rotation force, rotates the retention member out of the removal path.

In one aspect, a method of managing an expansion card disposed in a housing of an expansion card receiver in accordance with one or more embodiments of the invention includes receiving, by a card holder of the expansion card and while the card holder is disposed in a removal path of the expansion card, a force directed along the removal path; in response to receiving the force: translating a retention member of the card holder along the removal path away from the expansion card until the retention member reaches a translation limiter of the card holder to transition the retention member from a translatable state to a rotatable state, while the retention member is in the rotatable state and not in the translatable state: receiving, by the retention member, a rotation force directed out of the removal path; and in response to receiving the rotation force, rotate the retention member out of the removal path.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an information handling system in accordance with one or more embodiments of the invention.

FIG. 1.2 shows a diagram of a chassis in accordance with one or more embodiments of the invention.

FIG. 1.3 shows a diagram of an expansion card in accordance with one or more embodiments of the invention.

FIG. 2.1 shows a diagram of an expansion card receiver in a first state in accordance with one or more embodiments of the invention.

FIG. 2.2 shows a diagram of an expansion card receiver in a second state in accordance with one or more embodiments of the invention.

FIG. 2.3 shows a diagram of an expansion card receiver in a third state in accordance with one or more embodiments of the invention.

FIG. 2.4 shows a diagram of an expansion card disposed in an expansion card receiver in accordance with one or more embodiments of the invention.

FIG. 3.1 shows an isometric diagram of a card holder in accordance with one or more embodiments of the invention.

FIG. 3.2 shows a first top view diagram of the card holder of FIG. 3.1 in accordance with one or more embodiments of the invention.

FIG. 3.3 shows a second top view diagram of the card holder of FIG. 3.1 in accordance with one or more embodiments of the invention.

FIG. 3.4 shows a third top view diagram of the card holder of FIG. 3.1 in accordance with one or more embodiments of the invention.

DETAILED DESCRIPTION

Figure 4:
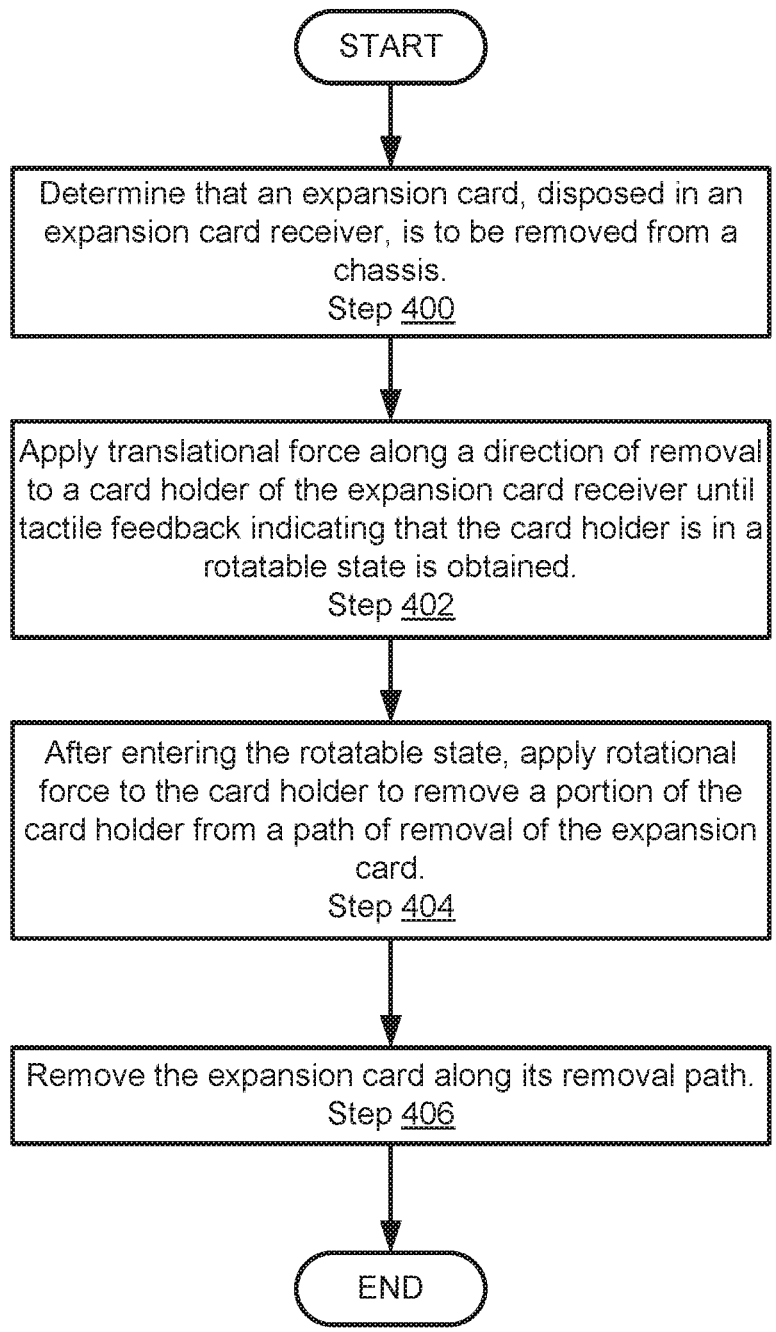
FIG. 4 shows a flowchart of a method of removing an expansion card from a chassis in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing components of an information handling system. An information handling system may be a system that provides computer implemented services. These services may include, for example, database services, electronic communication services, data storage services, etc.

To provide these services, the information handling system may include one or more computing devices. The computing devices may include any number of hardware components that facilitate providing of the services of the information handling system.

Overtime, hardware components may need to be removed from and/or added to the system. For example, the hardware components may become damaged, outdated, need to be tested, or otherwise need to be temporarily and/or permanently removed.

However, removal and/or insertion of a hardware component may be challenging. As computing devices have increased in sophistication, the packing density of hardware components has increased resulting in the hardware components being less physically accessible. Lack of physical access may reduce the ability of persons to understand how to manage components, may reduce the ability of persons to understand whether sufficient force has been applied to a component, may reduce the ability of person to understand whether to much force has been applied to a component, etc. For example, a person may not be able to see mechanisms that control the process of removal and/or insertion of components thereby depriving them of information necessary to perform insertions/removal in a manner that is unlucky to damage the components.

Embodiments of the invention may provide methods and devices for facilitating hardware component removal from and/or insertion into a system. Specifically, embodiments of the invention may provide an expansion card receiver that provides tactile feedback regarding the removal state and/or insertion state of a component. The tactile feedback may be used by a person to determine how much pressure to apply during a removal/insertion process.

By being provided tactile feedback, the person may be less likely to damage the expansion card, the expansion card receiver, or other components of a system. Consequently, embodiments of the invention may provide an information handling system that is more easily managed and less likely to suffer damage during management.

Additional embodiments of the invention may provide an expansion card receiver that provides physical support to expansion cards. To do so, the expansion card receiver may include a card holder that fixedly holds portions of the expansion card in place. By doing so, an expansion card may be less likely to bend, deform, or otherwise change shape in a manner that may result in undesired contact between the expansion card and other structures (e.g., portions of the expansion card receiver).

FIG. 1.1 shows an information handling system (10) in accordance with one or more embodiments of the invention. The system may include a frame (110) and any number of chassis (e.g., 110A, 100B, 100C).

The frame (110) may be a mechanical structure that enables chassis to be positioned with respect to one another. For example, the frame (110) may be a rack mount enclosure storage system that enables chassis (e.g., rack mount chassis or other types of form factors) to be disposed within it. The frame (110) may be implemented as other types of structures adapted to house, position, orient, and/or otherwise physically, mechanically, electrically, and/or thermally manage chassis. By managing chassis, the frame (110) may enable multiple chassis to be densely packed in space without negatively impacting the operation of the information handling system (10).

A chassis (e.g., 100A) may be a mechanical structure for housing components of an information handling system. For example, a chassis may be implemented as a rack mountable enclosure for housing components of an information handling system. The chassis may be adapted to be disposed within the frame (110) and/or utilize services provided by the frame (110) and/or other devices. The chassis may take on other form factors without departing from the invention.

While the information handling system (10) has been depicted in FIG. 1.1 as including multiple chassis, an information handling system in accordance with embodiments of the invention may include different numbers of chassis, be adapted to house chassis with different form factors, may include additional components, may include fewer components, and/or may include different components (e.g., other types of physical hardware such as network switches, routers, power supplies, cooling system, etc.).

Turning to FIG. 1.2, FIG. 1.2 shows a diagram of a chassis (100A) in accordance with one or more embodiments of the invention. A chassis may be a portion of an IHS and/or house all, or a portion, of an IHS. For example, a chassis may be a physical structure such as a rack mountable enclosure (or other standardized form factor compliant structure) that is adapted to house any number of components. The components of the chassis may be operably connected to other chassis and/or other devices via any combination of wired and/or wireless networks.

An information handling system may include a computing device (e.g., a collection of logical and/or physical devices for performing computations that may be used to provide computer implemented services) that provides any number of services. To provide services, the computing device may utilize computing resources provided by physical and/or logical components. The physical components may include, for example, processors, memory modules, storage devices, special purpose hardware, expansion cards (e.g., 130), and/or other types of physical components that contribute to the operation of the computing device. Logical components may be, for example, virtual entities (e.g., virtual machines, virtualized computing resources, etc.) that utilize the physical components to provide their respective functionalities. For additional details regarding computing devices, refer to FIG. 6.

Because the computing device uses computing resources to provide services (e.g., computer implemented services such as database services, instant messaging services, file storage services, etc.), the ability of the computing device to provide services is limited based on the number and/or quantity of hardware components that may be disposed within the chassis. For example, by adding additional processors, memory modules, special purpose hardware devices, expansion cards that include any number and type of hardware components, etc., the computing device housed, at least in part, in the chassis may be provided with additional computing resources (e.g., processor cycles, memory bandwidth, storage volume, communications bandwidth, special purpose functionality such as graphics generation, etc.) which it may use to provide computer implemented services.

In general, embodiments of the invention provide methods, devices, and systems for managing components that provide computing resources. Specifically, embodiments of the invention may provide a chassis that includes an expansion card receiver (120). The expansion card receiver (120) may be a physical device for receiving one or more expansion card (130). Once received, the expansion card receiver (120) may position, orient, provide power to, thermally manage, and/or otherwise manage the expansion cards (e.g., 120) disposed in the expansion card receiver.

In one or more embodiments of the invention, the expansion card receiver is adapted to tightly pack expansion cards within the internal volume of the chassis. Because the internal volume of the chassis is limited, increasing the packing density of hardware components such as expansion cards within the internal volume may improve the quantity of computing resources made available to the computing device.

However, by doing so, it may become difficult to physically insert and/or remove expansion card receivers to/from a chassis. For example, by increasing the density of components within the chassis, it may become difficult to physically manipulate an expansion card (130) in which an expansion card (130) is disposed. Further, by virtue of the densely packed environment of a chassis, it may be difficult to see or otherwise gain information regarding the structure of the expansion card receiver. In particular, while physically manipulating an expansion card receiver, a person's hands may block a view of the expansion card receiver. As will be discussed in greater detail below, embodiments of the invention may provide an expansion card receiver that is easily manipulated by a person and provides tactile feedback to the person while the person manipulates the expansion card receiver to indicate whether the person has activated certain features of the expansion card. By doing so, the expansion card receiver may make inserting and/or removing expansion cards less likely to result in damage to the expansion card receiver, the expansion card, and/or other components of a chassis in which the expansion card receiver is disposed.

An expansion card (e.g., 130) may be a component that provides computing resources to the computing device at least partially disposed within the chassis. For example, an expansion card (130) may be a device designed to operably connect to a computing device using a Peripheral Component Interconnect (PCI) slot (or other type of standards based or custom form factor). The expansion card receiver (120) may include any number of PCI slots or other types of mechanical and/or electrically operable connectors for connecting expansion cards. In turn, the aforementioned connector of the expansion card receiver may be operably connected to other components thereby enabling the expansion cards disposed within an expansion card receiver to be operably connected to other components (e.g., other components of a computing device such as processors, memory, storage, communication bridges, etc.).

The expansion card (130) may include, for example, a circuit card upon which any number of hardware components is disposed. The circuit card may operably connect the hardware components to the computing device (or other component to which the expansion card receiver is operably connected) via a PCI slot in which the expansion card (130) may be disposed.

To connect to the PCI slot, the expansion card (130) may include an edge connector or another type of connector designed to physically and/or electrically connect to the PCI slot (or another type of expansion card receiver included on an expansion card receiver). When so connected, the wiring on the circuit card of the expansion card (130) may operably connect the components of the expansion card (130) to any number of other components that are operably connected to the expansion card receiver. For additional details regarding expansion cards, refer to FIG. 1.3.

An expansion card receiver (120) in accordance with embodiments of the invention may include a mechanism for enabling expansion cards to be inserted and/or removed. The mechanism may fixedly position expansion cards in the expansion card receiver, provide tactile feedback as the mechanism is manipulated to release the expansion cards from their fixed position, and enable the expansion cards to be removed and/or inserted. By doing so, the processes of removing and/or inserting expansion cards may be reduced in complexity thereby reducing the likelihood that expansion cards, expansion card receivers, and/or other components may be damaged during expansion card insertion and/or removal.

In addition to the expansion card receiver (120) and expansion card (130), any number of other components (132) may be disposed in the chassis (100A). The other components (132) may include thermal management components such as fans, computing components such as processors, etc.

To further clarify aspects of embodiments of the invention, a diagram of an expansion card (130) in accordance with embodiments of the invention is provided in FIG. 1.3 and diagrams of an expansion card receiver in accordance with one or more embodiments of the invention are provided in FIGS. 2.1-2.4.

Turning to FIG. 1.3, FIG. 1.3 shows a diagram an expansion card (130) in accordance with one or more embodiments of the invention. An expansion card may be a physical device that provides computing resources to a computing device. For example, an expansion card may be implemented to provide special functions (e.g., implement as graphics processing units, co-processors, storage devices, etc.) or general purpose functions.

To provide its functionality, the expansion card (130) may include a circuit card (140). Hardware components (e.g., 150) may be disposed on the circuit card (140). Any number and type of hardware components (150) may be disposed on the circuit card. The hardware components (150) may include, for example, computer chips, resistors, capacitors, inductors, transformers, fuses, light emitting diodes, and/or other types of physical devices.

Due to the number of hardware components (150) and the flexibility of the circuit card (140), the expansion card (130) may be subject to deformation if not physically supported in a predetermined manner. For example, when the expansion card is positioned as illustrated in FIG. 1.3 and gravity is directed downward along the page, the circuit card may need to be supported on, at least, the left hand and right hand sides of the page. For example, if only an electrical connector (170) is physically attached, the right hand portion of the circuit card (140) may tend to bend downwards. As will be discussed in greater detail below with respect to FIGS. 2.1-2.4, an expansion card receiver in accordance with embodiments of the invention may include a mechanism that reversibly supplies support to the expansion card (130) in a manner that makes it less likely that the expansion card (130) will deform due to gravity or other forces applied to it while in use.

To enable other components to communicate with the hardware components (150), the expansion card (130) may include the electrical connector (170). The electrical connector (170) may conform to any format (e.g., standards based or custom). For example, the electrical connector (170) may be a PCI compliant connector such as an edge connector.

The electrical connector (170) and hardware components (150) may be operably connected to each other via circuitry (160). The circuitry may enable the hardware components (150) to electrically interact with each other and/or other components that may be connected through the electrical connector (170).

While illustrated as including a limited number of specific components, an expansion card in accordance with embodiments of the invention may include additional, different, and/or fewer components without departing from the invention.

Turning to FIG. 2.1, FIG. 2.1 shows a diagram of an expansion card receiver (200) in accordance with one or more embodiments of the invention. As discussed above, the expansion card receiver (200) may be adapted to receive expansion cards in a manner that enables them to be inserted and/or removed with a lower likelihood of damage to the expansion cards or other components occurring.

To receive expansion cards, the expansion card receiver (200) may include a housing (210). The housing (210) may be a physical structure adapted to (i) one or more expansion cards, (ii) physically connect to a chassis or other structures, and/or (iii) operably connect a received expansion card to other components.

To house expansion cards, the housing (210) may have an internal volume complimentary to a shape of the expansion card. For example, the internal volume of the housing (210) may be hollow to enable an expansion card to be disposed within it.

The housing (210) may also include at least one side through which an expansion card may be inserted and/or removed. For example, in FIG. 2.1, the right side of the expansion card receiver (200) is illustrated as being open except for the card holder (220), which will be discussed in greater detail below. The length and height of the open side may correspond to a cross section sufficient to enable the expansion card to be inserted into and/or removed out of the side.

Based on the position of the side through which the expansion card can be inserted and/or removed, an insertion/removal path (222) may be defined. The insertion/removal path (222) may be a path that, if followed by an expansion card in a predetermined orientation, the expansion card may be inserted into and/or removed from the housing (210).

The expansion card may also include an electrical connector (not illustrated) and/or mechanical support features (not illustrated) within the housing that (i) enable an expansion card received by the housing to be operably connected to other components (e.g., processors, memory modules, other components of a computing device) and (ii) support a portion of the expansion card received by the expansion card receiver, respectively.

However, as seen in FIG. 2.1, by virtue of having a side that is mostly open to allow the expansion card to be inserted into and/or removed from the housing (210), at least one side of the expansion card may not be secured by the mechanical support features of the housing (210).

The expansion card receiver (200) may include a card holder (220). The card holder (220) may be a physical structure that enables the expansion card receiver (200) to transition between (i) a first state in which an expansion card may be easily removed from or inserted into the housing (210) and (ii) a second state in which the expansion card is fixedly secured in the housing (210).

Additionally, the card holder (220) may provide a person with tactile feedback as the expansion card receiver (200) is transitioned between states. The tactile feedback may indicate to the person that mobility of the card holder (220) has been enabled and/or disabled.

For example, to enable the expansion card to be inserted into and/or removed from the housing (210), the card holder (220) may move to a position where it does not block the insertion/removal path (222). For details regarding moving to the position in which the card holder (220) does not block the insertion/removal path (222), refer to FIGS. 2.2-2.3.

To fixedly hold the expansion card, the card holder (220) may move to a position in which (i) it blocks the insertion/removal path (222) and (ii) physically contacts a portion of the expansion card to support it and/or prevent it from moving. For details regarding securing and/or supporting an expansion card using the card holder (220), refer to FIG. 2.4.

The card holder (220) may include at least two portions. The first portion may be an attachment member. The attachment member may (i) attach the card holder (220) to the housing (210) or other portion of the expansion card receiver and (ii) facilitate translation and rotation of a second portion of the card holder (220) to enable the second portion to move into and/or out of the insertion/removal path (222).

The card holder (220) may also include a retention member of the card holder. The retention member may (i) translate and/or rotate into and out of the insertion/removal path (222) and (ii) support/fix in place an expansion card while the expansion card is disposed in the housing (210).

For additional details regarding the various portions of the card holder (220), refer to FIGS. 3.1-3.4.

In FIG. 2.1, the expansion card receiver (200) is illustrated in a state in which an expansion card is not disposed in the housing (210) and the card holder (220) is disposed in a position in which it would (i) fixedly position/support a portion of an expansion card.

To enable an expansion card to be inserted into the housing (210), the card holder (220) may (i) translate away from the housing (210) along the insertion/removal path (222) and (ii) after translating away, rotate out of the insertion/removal path (222).

Turning to FIG. 2.2, FIG. 2.2 shows a second diagram of the expansion card receiver (200) in accordance with one or more embodiments of the invention. In FIG. 2.2, translation force (224)(illustrated as the arrow having a dashed tail) has been applied to the card holder (220) resulting in a retention member of the card holder moving away from the housing (210).

When the translation force (224) is applied to the card holder (220), the card holder (220) may provide tactile feedback to a person applying the translation force (224). The tactile feedback may indicate when a retention mechanism of the card holder (220) has been overcome. The retention mechanism may, prior to it being overcome, holder the card holder (220) in place as illustrated in FIG. 2.1.

By providing the tactile feedback to the person, the person may be made aware of an appropriate amount of translation force (224) to apply. For example, if the tactile feedback is not provided, the person may think that an appropriate amount has been provided even through the retention mechanism has not been overcome. Thus, by providing the tactile feedback to the person, the likelihood that the person may misunderstand the condition (i.e., whether it has been appropriately moved to a new position as illustrated in FIG. 2.2) of the card holder (220) may be reduced.

Until the card holder reaches the position as seen in FIG. 2.2, the card holder (220) may not be rotatable. In other words, the card holder (220) may not be able to be moved out of the insertion/removal path.

After the retention mechanism of the card holder (220) is overcome and the retention member of the card holder (220) is moved away from the housing, the support and/or fixed placement of an expansion card provided by the card holder (220) may be removed. For example, by moving away from the housing, the card holder (220) may no longer be in physical contact with an expansion card disposed in the expansion card receiver (200).

Turning to FIG. 2.3, FIG. 2.3 shows a third diagram of the expansion card receiver (200) in accordance with one or more embodiments of the invention. In FIG. 2.3, rotation force (225) (illustrated as the arrow having a dashed tail) has been applied to the card holder (220) resulting in a retention member of the card holder moving out of the insertion/translation path. Consequently, in the state illustrated in FIG. 2.3, an expansion card may be inserted into and/or removed from the housing (210).

Turning to FIG. 2.4, FIG. 2.4 shows a fourth diagram of the expansion card receiver (200) in accordance with one or more embodiments of the invention. In FIG. 2.4, an expansion card (230) has been inserted into the housing (210) and the card holder (220) has been returned to its position illustrated in FIG. 2.1.

By returning to its position illustrated in FIG. 2.1, the card holder (220) may (i) block removal/insertion of the expansion card (230) via the insertion/removal path and (ii) may physical contact with a portion of the expansion card. The physical contact made with the portion of the expansion card may provide support (e.g., positioning/orienting/retaining force) to the portion of the expansion card (230) proximate to the card holder (220). By being positioned near what would otherwise be an open side of the housing (210), the card holder (220) may provide support (e.g., hold the expansion card (230) in place) to the expansion card (230). Consequently, the expansion card (230) may be less likely to warp, bend, or otherwise deform in manners that may be disadvantageous (e.g., may cause a portion of the expansion card (230) to come into contact with a portion of the housing (210) that may result in damage to the expansion card (230) or otherwise cause undesired contact between the housing (210) and expansion card (230)).

By supporting the expansion card (230), forces such as gravity, movement of a chassis and/or expansion card receiver (200) may be less likely to result in undesired contact between the expansion card (230) and the housing (210) and/or other components disposed in a chassis. Further, reducing the likelihood of the expansion card (230) moving or deforming, the quality of contact between an electrical connector of the expansion card (230) and corresponding electrical connector on the expansion card receiver (200) may be improved.

For example, the electrical contacts of the electrical connectors of the expansion card and expansion card receiver may be sensitive to misalignment. By fixedly positioning the expansion card (230), the card holder (220) may reduce the possibility of misalignment between the aforementioned electrical contacts of the electrical connectors that could otherwise result in short circuits or undesirable connections between electrical contacts.

While the expansion card receiver (200) has been illustrated a limited number of specific components in FIGS. 2.1-2.4, an expansion card receiver in accordance with embodiments of the invention may include additional, different, and/or fewer components without departing from the invention.

The components of the expansion card receiver (200) may be formed from any suitable material and/or combination of materials. The materials may include, for example, metals and plastics. For example, the housing may be formed using bent sheet metal. In another example, the card holder (220) may be formed using injection molded plastic.

As discussed above, the card holder (220) of the expansion card receiver (200) may be used to fixedly, reversibly position and hold expansion cards. FIGS. 3.1-3.4 show diagrams of card holders that be me used to position and/or hold expansion cards.

Turning to FIG. 3.1, FIG. 3.1 shows an isometric diagram of the card holder (220) in accordance with one or more embodiments of the invention. The card holder (220) may include at least to portions.

A first portion of the card holder (220) may be an attachment member (300). The attachment member (300) may be a physical structure adapted to attach the card holder (220) to a housing or other portion of an expansion card. The attachment member (300) may also be adapted to enable a second portion of the card holder (220) to translate over a predetermined range with respect to the attachment member (300), rotate over a predetermined range with respect to the attachment member (300), and generate tactile feedback as the second portion of the card holder (220) translates and/or rotates with respect to the card holder.

To enable the attachment member (300) to a housing or other structure, the attachment member (300) may include through holes (e.g., 300). The through holes may enable bolts or other structures to physically attach the attachment member (300) to other structures.

To enable the second portion of the card holder (220) to translate with respect to the attachment member (300), the attachment member (300) may include slots (e.g., 325). The slots may be physical structure into which portion of the second portion of the card holder (220) may be disposed. The slots may limit the ability of the second portion of the card holder (220) to translate along a predetermined path (i.e., a path defined by the length/orientation of the slots).

The slots may also enable the second portion of the card holder (220) to rotate with respect to the attachment member (330) when the second portion of the card holder (220) is disposed at one or more predetermined locations along the predetermined path defined by the slots (e.g., sliding pivot joint slot (325)). As will be shown in greater detail with respect to FIG. 3.2, the predetermined locations along the predetermined path defined by the slots may include an end of the predetermined path (e.g., when the second portion of the card holder (220) is furthest away from the attachment member (300)).

To enable the second portion of the card holder (220) to rotate, the slots may include a portion that forms a rotational joint with respect to the second portion of the card holder (220). For additional details regarding the rotational joint, refer to FIG. 3.2.

To generate tactile feedback, the attachment member (300) may include a tactile feedback generator slot (350). The tactile feedback generator slot may be a slot in which a tactile feedback generator (340) of the second portion of the card holder (220) may be disposed. The tactile feedback generator slot (350) may include physical members disposed along the slot that interact with the tactile feedback generator (340) to generate tactile feedback when the second portion of the card holder (220) passes predetermined positions with respect to the attachment member (300).

For example, as the second portion of the card holder (220) translates with respect to the attachment member (300), the physical members may physically interact with the tactile feedback generator (340) to generate vibrations sensible by a person toughing the card holder (220). In addition to being tactile, the vibrations may also be audible in some embodiments of the invention.

A second portion of the card holder (220) may be a retention member (310). The retention member may be adapted to (i) fixedly hold an expansion card when the retention member (310) is in a first position (e.g., as illustrated in FIG. 2.4) and (ii) enable expansion cards to be inserted into or removed from a housing when the retention member (310) is in a second position (e.g., as illustrated in FIG. 2.3).

The expansion card may be formed using an insertion portion (312) and a riser portion (362). The insertion portion (312) may be a physical structure adapted to be inserted into slots or other corresponding portions of the attachment member (300). The insertion portion (312) may limit the ability of the retention member (310) to translate and/or rotate with respect to the attachment member.

For example, the insertion portion (312) may include one or more sliding pivot joints (e.g., 320). The sliding pivot joints (320) may be adapted to slide along sliding pivot joint slots (e.g., 325) and form rotational joints with the attachment member while disposed as predetermined locations along the sliding pivot joint slots (e.g., 325). When a rotational joint is formed, the retention member (310) may be able to rotate with respect to the attachment member (300) across a predetermined range of rotation that enables the riser portion (362) to move into/out of the way of the insertion/removal path of the housing.

The insertion portion (312) may also be adapted to generate tactile feedback when the retention member (310) translates with respect to predetermined locations along the attachment member (300). To do so, the insertion portion (312) may include a tactile feedback generator (340) that is adapted to interact with a tactile feedback generator slot (350) of the attachment member (300) while the retention member (310) translates with respect to the attachment member (300) to generate tactile feedback.

For example, the tactile feedback generator (340) may include bumps, lips, or other structures that create interferences with corresponding portions of the tactile feedback generator slot (350) when the retention member (310) as disposed at predetermined locations with respect to the attachment member (300). The interferences may cause these structures to deform or otherwise build up internal stress that when relieved generates the tactile feedback. Thus, as the retention member (310) translates with respect to the attachment member (300), the retention member (310) and attachment member (300) may generate and relieve forces with respect to each other that create the tactile feedback.

The insertion portion (312) may also have a shape (e.g., ramp) that interacts with a ramp (327) or other structure on the attachment member (300) that tends to fixedly lock the retention member (310) in a predetermined location when the attachment member (300) is positioned at a predetermined location (e.g., the location illustrated in FIG. 2.4) with respect to the attachment member (300). For example, the shape of the insertion portion (312) may generate an interference with the ramp (327) thereby causing tending to lock the retention member (310) in place.

For example, the ramp (327) of the attachment member (300) may cause the insertion portion (312) of the card holder (220) to be pressed against the housing or other structure as the retention member (310) is pressed against an expansion card disposed in the housing.

The riser portion (362) may be a physical structure adapted to (i) move into and out of the insertion/removal path of the housing and (ii) hold/support a portion of an expansion card. To do so, the riser portion (362) may include an edge holder (360). The edge holder (360) may include a slot or other structure that engages with a portion of an expansion card when the riser portion (362) is pressed against the expansion card. The edge holder (360) may position and/or orient the portion of the expansion card.

Turning to FIG. 3.2, FIG. 3.2 shows a top view diagram of the card holder. A seen from FIG. 3.2, the structure of the retention member (310) may be adapted to enable it to be partially inserted into the slots of the attachment member. When so inserted, the retention member (310) may only be able to translate and rotate with respect to the attachment member (300) across predetermined ranges.

Turning to FIG. 3.3, FIG. 3.3 shows a second top view diagram of the card holder. In FIG. 3.3, a portion of the retention member (310) has been inserted into the slots of the attachment member. In this position, the retention member (310) is disposed at a first end of its translation range (similar to the position illustrated in FIG. 2.2). In this position, a rotational joint (370) is formed between the retention member (310) and the attachment member (300) thereby enabling the retention member (310) to rotate between the positions illustrated in FIGS. 2.2-2.3.

Turning to FIG. 3.4, FIG. 3.4 shows a third top view diagram of the card holder. In FIG. 3.4, the retention member (310) is disposed at a second end of its translation range (similar to the position illustrated in FIG. 2.4). In this position, the rotational joint has been removed by virtue of the new relative positions of the two members with respect to each other.

Additionally, an interference (372) between the retention member (310) and the attachment member (300) has been formed. For example, as the retention member translated downward in FIG. 3.4 with respect to the attachment member (300) deformable bumps (374) on the retention member (310) and attachment member (300) passed each other causing (i) the interference (372) to be generated and (ii) tactile feedback to be generated as the deformable bumps (374) passed by one another.

The interference (372) between these members may cause the retention member (310) to be fixedly held in place with respect to the attachment member (300) thereby causing the retention member (310) to be fixedly pressed against an expansion card in the housing of the expansion card receiver. The interference (372) may require force to be applied to the retention member (310) for the retention member (310) to move with respect to the attachment member (300). Additionally, moving the retention member (310) by application of pressure by a person may cause the interference (372) to be dissipated thereby, again, generating tactile feedback that may be provided to a person operating the card holder. The aforementioned tactile feedback may let the person know that they have applied an appropriate amount of pressure to relieve the interference (372) and cause the retention member (310) to move with respect to the attachment member (300). Accordingly, the person may not be required to guess whether or not an appropriate amount of pressure has been applied to the retention member.

To cause the retention member (310) to move with respect to the attachment member (300), the person may press against the retention member using a finger (380), tool, or other structure as indicated by the large arrow shown in FIG. 3.4. To move from the position illustrated in FIG. 3.4 to that illustrated in FIG. 3.3, a person may use their finger (380) or other structure to pull the retention member (310) away from the attachment member (300).

Once at the position indicated in FIG. 3.3, the person may use their finger (380) to rotate (e.g., into the page as illustrated in FIG. 3.3 using the arrow with dashed tail) the retention member about a rotational axis (382) of the rotational joint (370).

Figure 5:
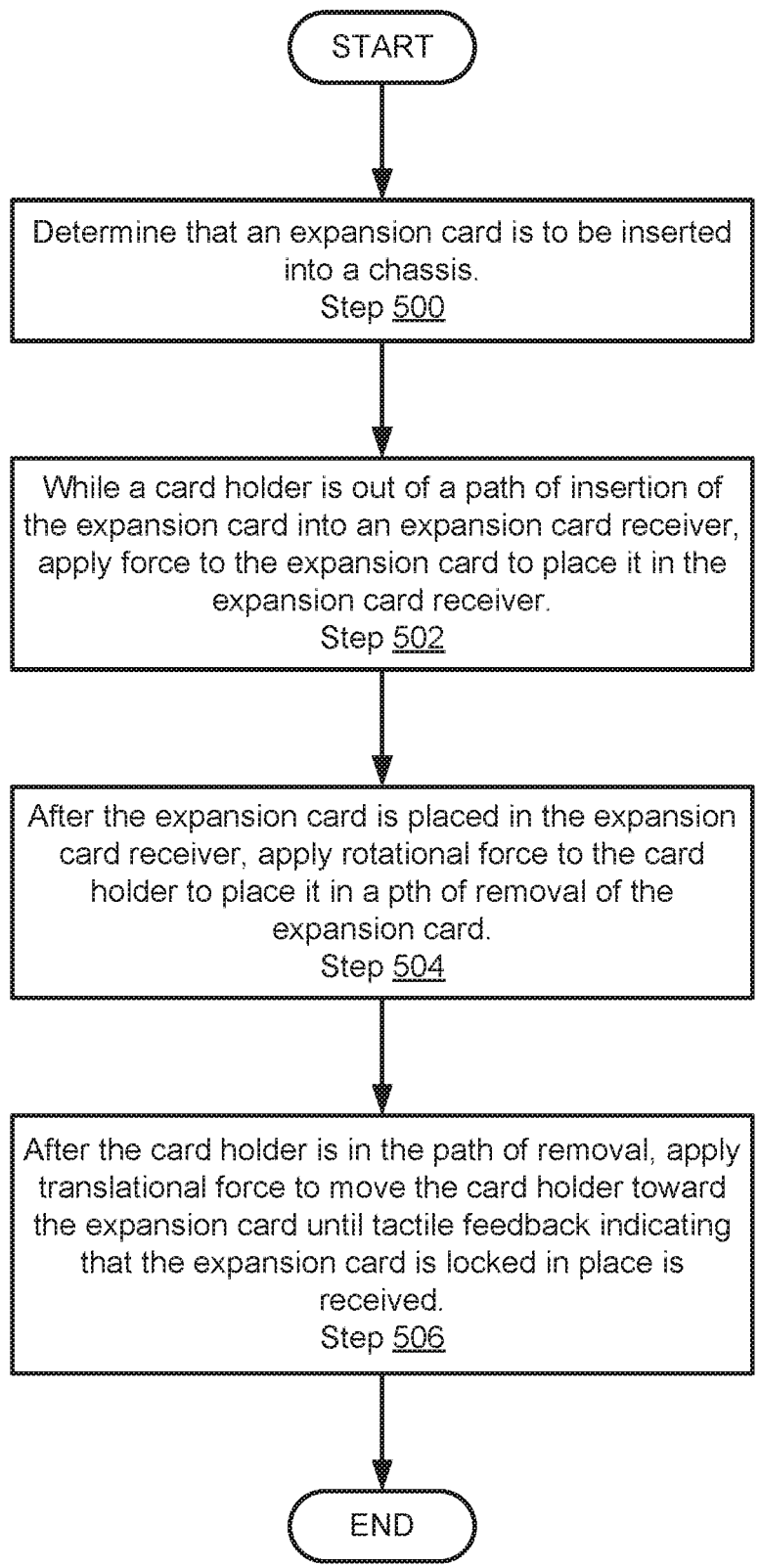
FIG. 5 shows a flowchart of a method of inserting an expansion card into a chassis in accordance with one or more embodiments of the invention.

Returning to FIG. 2.1, an expansion card receiver (e.g., 200) may be used to manage expansion cards. To do so, the expansion card receiver (e.g., 200) may fixedly hold expansion cards and provide tactile feedback when the expansion cards are released from or being subject to being held in place. FIGS. 4-5 illustrate methods that may be used to remove and/or insert expansion cards. To do so, the expansion card receiver (e.g., 120) may fixedly hold expansion cards and provide tactile feedback when the expansion cards are released from or being subject to being held in place. FIGS. 4-5 illustrate methods that may be used to remove and/or insert expansion cards.

FIG. 4 shows a method that may be performed to remove an expansion card from an expansion card receiver in accordance with one or more embodiments of the invention. While FIG. 4 is illustrated as a flowchart including a number of steps, methods in accordance with embodiments of the invention may include additional, fewer, and/or different steps without departing from the invention. Additionally, while the steps illustrated in FIG. 4 are illustrated in a particular order, the steps may be performed in a different order, any number of steps may be omitted, any number of steps may be repeated, and/or any number of steps may be performed in a parallel or partially overlapping manner without departing from the invention. The method shown in FIG. 5 may be performed using, for example, an expansion card receiver (e.g., 200, FIG. 2.1).

In step 400, it is determined that an expansion card is to be removed from a chassis. The determination may be made, for example, based on an indication provided by a computing device disposed in the chassis. The chassis may include an expansion card receiver in which the expansion card is disposed.

For example, when an expansion card fails, enters an error state, or becomes otherwise inoperable, it may be necessary to remove the expansion card. By removing the expansion card, the expansion card may be tested, the expansion card receiver may be tested, the computing device operably connected to the expansion card may be tested, and/or other diagnostic testing be performed. Similarly, by removing the expansion card, a different expansion card having similar capabilities and/or features may be replaced in the expansion card receiver thereby enabling the computing device which the expansion card receiver is operably connected to continue to use the functionality of the newly replaced expansion card. Further, an expansion card may be removed and replaced by a different expansion card to provide a computing device with other capabilities than that provided by the now-replaced expansion card.

In step 402, translational force along a path of removal is applied to a card holder of the expansion card receiver until tactile feedback indicating that the card holder is in a rotatable state is obtained. The translation force may be applied by a finger of a person. For example, the person may apply force to a retention member of the card holder that is directed away from the expansion card.

Apply such force may cause the retention member to move with respect to an attachment member of the card holder. The movement of the card holder may be an interference between the attachment member and retention member to be relieved. Relieving the interference may generate vibrations that may be sensed through the finger of the person and/or heard.

Applying the translational force may cause the retention member of the card holder to transition between its position and orientation as illustrated in FIG. 2.1 to its position and orientation as illustrated in FIG. 2.2.

In step 404, after entering the rotatable state, rotational force is applied to the card holder to remove a portion of the card holder from a path of removal of the expansion card. For example, applying the rotational force may cause the retention member of the card holder to transition between its position and orientation as illustrated in FIG. 2.2 to its position and orientation as illustrated in FIG. 2.3.

In step 406, the expansion card is removed along its removal path. For example, with respect to FIG. 2.1, an expansion card may be moved out of the housing through the open, right hand side of the housing.

The method may end following step 406.

FIG. 5 shows a method that may be performed to insert an expansion card into a chassis. While FIG. 5 is illustrated as a flowchart including a number of steps, methods in accordance with embodiments of the invention may include additional, fewer, and/or different steps without departing from the invention. Additionally, while the steps illustrated in FIG. 5 are illustrated in a particular order, the steps may be performed in a different order, any number of steps may be omitted, any number of steps may be repeated, and/or any number of steps may be performed in a parallel or partially overlapping manner without departing from the invention. The method shown in FIG. 5 may be performed using, for example, an expansion card receiver (e.g., 200, FIG. 2.1).

In step 500, it is determined that an expansion card is to be inserted into a chassis. The determination may be made, for example, completion of the method illustrated in FIG. 4 in a case where the expansion card is being replaced by another expansion card or the expansion card is temporarily removed and reinserted.

In step 502, while a card holder is out of an insertion path of the expansion card into an expansion card receiver, force is applied to the expansion card to place it into the expansion card receiver. For example, the expansion card receiver may be in the state illustrated in FIG. 2.3. In this state, the right hand side of the housing may be open an unblocked by the card holder of the expansion card receiver. Consequently, a person may readily insert an expansion card through the open, right hand side of the housing by grasping the expansion card and moving it through the open, right hand side of the housing.

Inserting the expansion card in this manner may fixedly attach an electrical connector or other portions of the expansion card to corresponding portion of the expansion card receiver. However, expansion card may not be supported or fixedly held in place proximate to the side of the housing through which it was inserted into the housing.

In step 504, after the expansion card is placed in the expansion card receiver, rotational force is applied to the card holder to place it in a path of removal of the expansion card. For example, force may be applied to a retention portion of the card holder as illustrated with respect to FIG. 3.3 to cause it to rotate into the removal path. By doing so, an edge holder or other portion of the card holder that may support the expansion card may be aligned with a corresponding portion of the expansion card (e.g., an edge of a circuit card).

In step 506, after the card holder is in the path of removal, translational force is applied to move the card holder toward the expansion card until tactile feedback indicating that the expansion card is locked in place is received. The translation force may be applied as described with respect to FIG. 3.4. The tactile feedback may be generated by deformable bumps or other features of the retention member interacting with corresponding structures on the attachment member of the card holder by virtue of the movement of the retention member with respect to the attachment member. Generation of the tactile feedback may indicate that the retention member is at the end of the translation allowed by the attachment member and also that the retention member is now positioned at a location where it is able to support the edge of the expansion card that was otherwise unsupported by portions of the housing or other structures of the expansion card receiver.

The method may end following step 506.

Using the methods illustrated in FIGS. 4-5, embodiments of the invention may provide methods for inserting and/or remove expansion cards into/from chassis in a manner that reduces the chance of damage occurring by providing persons with tactile feedback regarding the process of insertion/removal.

Figure 6:
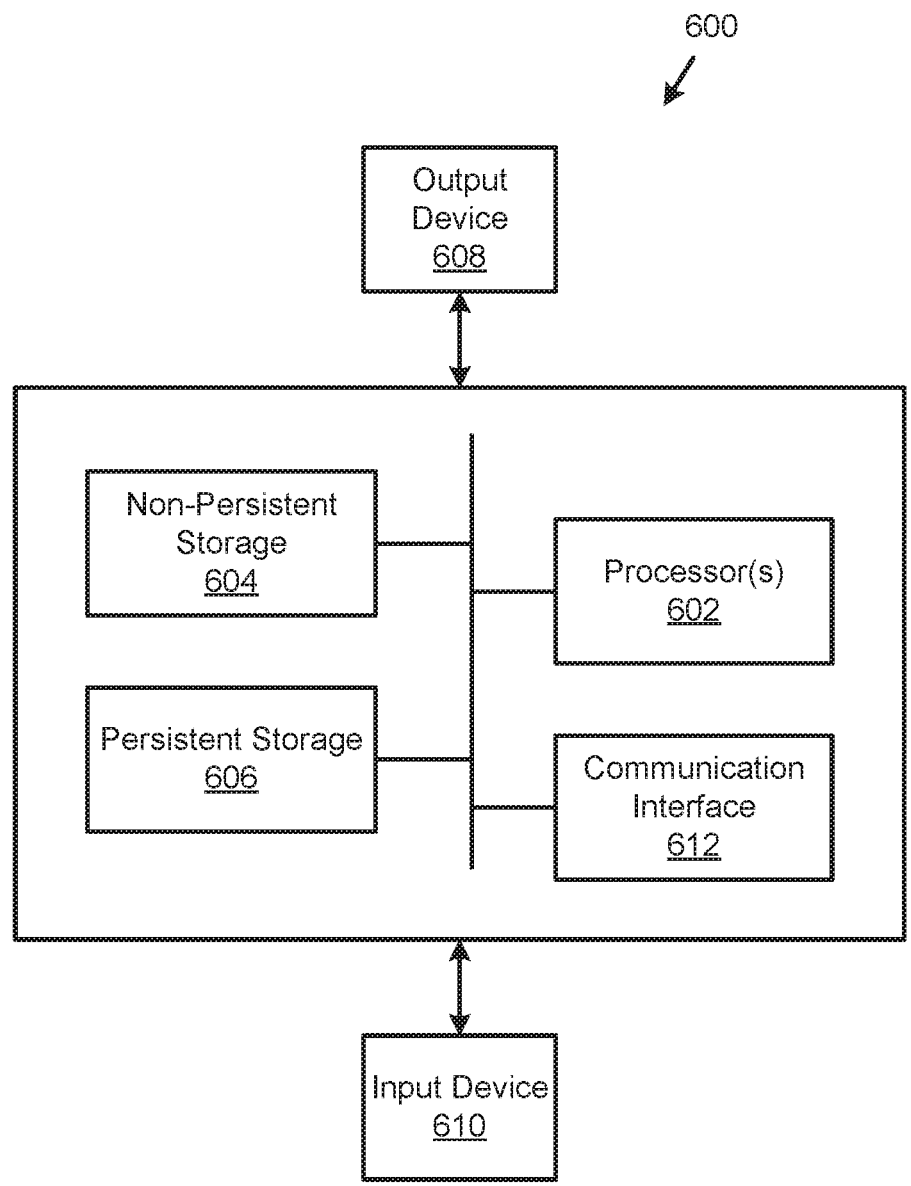
FIG. 6 shows a diagram of a computing device in accordance with one or more embodiments of the invention.

As discussed above, embodiments of the invention may be implemented using a computing device. FIG. 6 shows a diagram of a computing device in accordance with one or more embodiments of the invention. The computing device (600) may include one or more computer processors (602), non-persistent storage (604) (e.g., volatile memory, such as random access memory (RAM), cache memory), persistent storage (606) (e.g., a hard disk, an optical drive such as a compact disk (CD) drive or digital versatile disk (DVD) drive, a flash memory, etc.), a communication interface (612) (e.g., Bluetooth interface, infrared interface, network interface, optical interface, etc.), input devices (610), output devices (608), and numerous other elements (not shown) and functionalities. Each of these components is described below.

In one embodiment of the invention, the computer processor(s) (602) may be an integrated circuit for processing instructions. For example, the computer processor(s) may be one or more cores or micro-cores of a processor. The computing device (600) may also include one or more input devices (610), such as a touchscreen, keyboard, mouse, microphone, touchpad, electronic pen, or any other type of input device. Further, the communication interface (612) may include an integrated circuit for connecting the computing device (600) to a network (not shown) (e.g., a local area network (LAN), a wide area network (WAN) such as the Internet, mobile network, or any other type of network) and/or to another device, such as another computing device.

In one embodiment of the invention, the computing device (600) may include one or more output devices (608), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (602), non-persistent storage (604), and persistent storage (606). Many different types of computing devices exist, and the aforementioned input and output device(s) may take other forms.

Embodiments of the invention may provide an improved method for managing components of an information handling system. Specifically, embodiments of the invention may provide a method, system, and device for facilitating removal and insertion of expansion cards in a manner that is less likely to result in damage to the expansion card and/or expansion card receiver. To do so, embodiments of the invention may provide an expansion card receiver that includes mechanisms for generating tactile feedback that indicate progress regarding the insertion/removal process. The information may information a person regarding whether more force should be applied, less force should be applied, the relative locations of different portions of the expansion card receiver during the process, and/or other information that may enable a person to better able ascertain the overall process of expansion card insertion/removal.

By doing so, embodiments of the invention may address the problem of limited information regarding the state of a system. By providing tactile feedback, a person may be bettered informed regarding the state of the system.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A chassis for housing a computing device of an information handling system, comprising:
   a housing of an expansion card receiver adapted to house an expansion card and limit removal of the expansion card to a removal path; and
   a card holder of the expansion card, wherein the card holder is adapted to:
      while a retention member of the card holder is disposed in the removal path, receive a translation force directed away from the expansion card along the removal path;
      in response to receiving the translation force:
         translate the retention member along the removal path away from the expansion card until the retention member reaches a translation limiter to transition the retention member from a translatable state to a rotatable state,
      while the retention member is in the rotatable state and not in the translatable state:
         receive a rotation force directed out of the removal path; and
         in response to receiving the rotation force, rotate the retention member out of the removal path.

2. The chassis of claim 1, wherein the card holder is further adapted to:
   while the retention member is translating in response to the translation force, generate a tactile feedback to notify a person applying the translation force that the retention member is translating with respect to an attachment member of the card holder.

3. The chassis of claim 2, wherein the attachment member is adapted to:
   attach to the housing, and
   provide a pivot about which the retention member is rotatable while the retention member is in the rotatable state.

4. The chassis of claim 3, wherein the attachment member is further adapted to:
   provide a path about which the retention member is translatable while the retention member is in the translatable state.

5. The chassis of claim 1, wherein the retention member comprises:
   an edge holder adapted to secure an edge of the expansion card while the retention member is disposed next to the expansion card.

6. The chassis of claim 5, wherein securing the edge of the expansion card positions an edge of the expansion card at a predetermined location within the housing.

7. The chassis of claim 1, wherein the card holder comprises a ramp that, prior to translation of the retention member, creates an interference with the card holder that holds the card holder in place.

8. The chassis of claim 7, wherein the ramp is adapted to, after translation of the retention member, eliminate the interference.

9. An expansion card receiver, comprising:
   a housing adapted to house an expansion card and limit removal of the expansion card to a removal path; and
   a card holder adapted to:
      while a retention member of the card holder is disposed in the removal path, receive a translation force directed away from the expansion card along the removal path;
      in response to receiving the translation force:
         translate the retention member along the removal path away from the expansion card until the retention member reaches a translation limiter to transition the retention member from a translatable state to a rotatable state,
      while the retention member is in the rotatable state and not in the translatable state:
         receive a rotation force directed out of the removal path; and
         in response to receiving the rotation force, rotate the retention member out of the removal path.

10. The expansion card receiver of claim 9, wherein the card holder is further adapted to:
    while the retention member is translating in response to the translation force, generate a tactile feedback to notify a person applying the translation force that the retention member is translating with respect to an attachment member of the card holder.

11. The expansion card receiver of claim 10, wherein the attachment member is adapted to:
    attach to the housing, and
    provide a pivot about which the retention member is rotatable while the retention member is in the rotatable state.

12. The expansion card receiver of claim 11, wherein the attachment member is further adapted to:
    provide a path about which the retention member is translatable while the retention member is in the translatable state.

13. The expansion card receiver of claim 9, wherein the retention member comprises:
    an edge holder adapted to secure an edge of the expansion card while the retention member is disposed next to the expansion card.

14. The expansion card receiver of claim 13, wherein securing the edge of the expansion card positions an edge of the expansion card at a predetermined location within the housing.

15. The expansion card receiver of claim 9, wherein the card holder comprises a ramp that, prior to translation of the retention member, creates an interference with the card holder that holds the card holder in place.

16. The expansion card receiver of claim 15, wherein the ramp is adapted to, after translation of the retention member, eliminate the interference.

17. A method of managing an expansion card disposed in a housing of an expansion card receiver, comprising:
    receiving, by a card holder of the expansion card and while the card holder is disposed in a removal path of the expansion card, a force directed along the removal path;
    in response to receiving the force:
       translating a retention member of the card holder along the removal path away from the expansion card until the retention member reaches a translation limiter of the card holder to transition the retention member from a translatable state to a rotatable state,
    while the retention member is in the rotatable state and not in the translatable state:
       receiving, by the retention member, a rotation force directed out of the removal path; and in response to receiving the rotation force, rotate the retention member out of the removal path.

18. The method of claim 17, further comprising:
generating tactile feedback while the retention member translates along the removal path, wherein the tactile feedback indicates that the retention member is no longer fixed in place by an interference between the retention member and an attachment member of the card holder.

19. The method of claim 18, wherein the attachment member attaches the retention member to the housing.

20. The method of claim 17, further comprising:
generating an interference between the retention member and another portion of the card holder while the retention member translates towards the expansion card.

\* \* \* \* \*